US006191615B1

United States Patent
Koga

(10) Patent No.: US 6,191,615 B1
(45) Date of Patent: Feb. 20, 2001

(54) LOGIC CIRCUIT HAVING REDUCED POWER CONSUMPTION

(75) Inventor: Hiroshi Koga, Tokyo (JP)

(73) Assignee: NEC Corporation, Tokyo (JP)

(*) Notice: Under 35 U.S.C. 154(b), the term of this patent shall be extended for 0 days.

(21) Appl. No.: 09/276,940

(22) Filed: Mar. 26, 1999

(30) Foreign Application Priority Data

Mar. 30, 1998 (JP) .................................................. 10-083692

(51) Int. Cl.[7] .............................................. H03K 19/0185
(52) U.S. Cl. ................................. 326/81; 326/83; 327/534
(58) Field of Search ................................ 326/80, 81, 82, 326/83, 86; 327/534, 535

(56) References Cited

U.S. PATENT DOCUMENTS 5,612,643 * 3/1997 Hirayama ............................. 327/534
5,703,522 * 12/1997 Arimoto et al. ...................... 327/534
5,748,016 * 5/1998 Kurosawa ............................ 327/534
6,046,627 * 4/2000 Itoh et al. ............................ 327/534

FOREIGN PATENT DOCUMENTS 6-21443   1/1994  (JP).
9-55470   2/1997  (JP).

* cited by examiner

Primary Examiner—Michael Tokar
Assistant Examiner—Don Phu Le
(74) Attorney, Agent, or Firm—Young & Thomspon

(57) ABSTRACT

A logic circuit which is driven at low voltage and operates at high speed and low power consumption is provided. Substrate potentials of P and N type transistors MP11 and MN11 constituting an inverter are controlled correspondingly to a stable state of the inverter. In a stable state of the inverter in which the P type transistor MP11 is ON, the substrate potential of the N type transistor MN11 which is OFF is lowered to ground potential or lower and, in a stable state of the inverter in which the N type transistor MN11 is ON, the substrate potential of the P type transistor MP11 which is OFF is raised to a power source potential or higher.

10 Claims, 8 Drawing Sheets

LOGIC CIRCUIT HAVING REDUCED POWER CONSUMPTION

BACKGROUND OF THE INVENTION

1. Field of the Invention

The present invention relates to a logic circuit constructed with MIS FET's (Metal-Insulator-Semiconductor Field Effect Transistors) and, particularly, to a logic circuit whose power consumption is reduced.

2. Description of Related Art

In the recent design of a CMIS integrated circuit, attention is paid to a technique for reducing power consumption thereof. This tendency is related mainly to the heat generation problem due to recent increases in device operating speed and the popularization of mobile devices.

That is, when an operating frequency is increased due to an increase of the operating speed of the device, the frequency of switching is increased and, hence, the power consumption is increased, resulting in increased heat generation. The device generating a large amount of heat requires a heat radiating technique or a device cooling technique, causing manufacturing cost to be increased. Therefore, in order to reduce the device manufacturing cost and make such a radiator or cooling device unnecessary, the power consumption must be reduced.

On the other hand, the mobile device uses a battery as a power source. Therefore, the increase of power consumption leads to a reduction of the driving time of the battery. Therefore, in order to avoid a reduction of the drive time of the battery, the reduction of the power consumption is also necessary.

Under the circumstance, the necessity of a technique for reducing power consumption of a device is becoming more and more important.

Various methods for reducing power consumption have been proposed. Among them, a method for operating a device at a low voltage by reducing a source voltage is the most effective. However, when the source voltage is reduced, a new problem that a switching speed of a MIS FET is lowered occurs. Therefore, a method for reducing a source voltage without reducing the switching speed of the MIS FET by reducing an absolute value of a threshold value Vt of the MIS FET has been proposed. For a device having a source voltage of, for example, 5V, the absolute value of the threshold value Vt is about 0.7V. In order to prevent the switching speed of the MIS FET from being lowered when the source voltage is reduced to as low as 1.8V to 2.0V, the absolute value of the threshold value Vt is lowered to as low as 0.3V to 0.4V.

When the absolute value of the threshold value Vt is lowered, a leak current of the MIS FET during an OFF time thereof is increased, causing the power consumption of the logic circuit constructed with MIS FET's to be increased. Therefore, the effect of reduction of power consumption obtained by reducing the source voltage can not be utilized effectively.

In order to solve this problem, Japanese Patent Application Laid-open Nos. Hei 6-21443 and Hei 9-55470 propose techniques in which the leak current when the MIS FET is in OFF state is reduced by controlling a substrate potential of the MIS FET during a time period in which a logic circuit constructed with MIS FET's is in inactive state, that is, during an idle time. According to the disclosed techniques, the leak current of the logic circuit in the idle time can be reduced. However, in a time period in which the logic circuit is in active state, that is, the logic circuit is operating, there is completely no reduction of power consumption since the leak current continuously flows. Consequently, the total reduction effect of power consumption is low and, particularly, in a case where the inactive state time is short, the reduction of power consumption is very low.

SUMMARY OF THE INVENTION

An object of the present invention is to provide a logic circuit using MIS FET's whose leak current is always small regardless of the state of the logic circuit.

The logic circuit according to the present invention is constructed such that substrate potentials of respective transistors constituting the logic circuit are changed correspondingly to stable states of the logic circuit. That is, an embodiment of the logic circuit according to the present invention comprises a first transistor of one conductivity type connected between a first power source terminal and an output terminal, a second transistor of the other conductivity type connected between a second power source terminal and the output terminal, means for supplying input signals to control terminals of the first and second transistors, first substrate potential control means for controlling a substrate potential of the first transistor in response to the input signals and a signal appearing at the output signal and second substrate potential control means for controlling a substrate potential of the second transistor in response to the input signal and the signal appearing at the output terminal.

Another embodiment of the present logic circuit comprises a first transistor of one conductivity type connected between a first power source terminal and an output terminal, a second transistor of the other conductivity type connected between a second power source terminal and the output terminal, means for supplying input signals to control terminals of the first and second transistors, first substrate potential control means for supplying a potential different from a source potential of the second transistor to the substrate of the second transistor when the first transistor and the second transistor become a conductive state and a non-conductive state, respectively, according to the input signals and second substrate potential control means for supplying a potential different from a source potential of the first transistor to the substrate of the first transistor when the first transistor and the second transistor become a non-conductive state and a conductive state, respectively, according to the input signals.

Another embodiment of the logic circuit according to the present invention comprises a first transistor of one conductivity type connected between a first power source terminal and an output terminal, a second transistor of the other conductivity type connected between a second power source terminal an d the output terminal, first substrate potential control means for supplying a potential different from a potential of the second power source terminal to the substrate of the second transistor when the potential of the output terminal is the potential of the first power source terminal and second substrate potential control means for supplying a potential different from a potential of the first power source terminal to the substrate of the first transistor when the potential of the output terminal is the potential of the second power source terminal.

In the logic circuit of the present invention, it is possible to make the threshold voltage of a transistor in ON state different from the threshold voltage of a transistor in OFF state. As a result, it is possible to obtain a logic circuit operable at high speed with reduced power consumption.

That is, in the logic circuit according to the present invention, the threshold voltages of the transistors constituting the logic circuit is changed actively in response to ON/OFF state of the transistors.

A further embodiment of the logic circuit according to the present invention comprises a first power source terminal, an output terminal, a transistor connected between the first power source terminal and the output terminal, means for supplying an input signal to a control terminal of the transistor and substrate potential control means for controlling a substrate potential of the transistor in response to the input signal and a signal at the output terminal. That is, the present invention can be applied to a logic circuit using a pull-up resistor.

BRIEF DESCRIPTION OF THE DRAWINGS

The above mentioned and other objects, features and advantages of the present invention will become more apparent by reference to the following detailed description of the invention taken in conjunction with the accompanying drawings, in which.

DETAILED DESCRIPTION OF THE PREFERRED EMBODIMENTS

Figure 1:
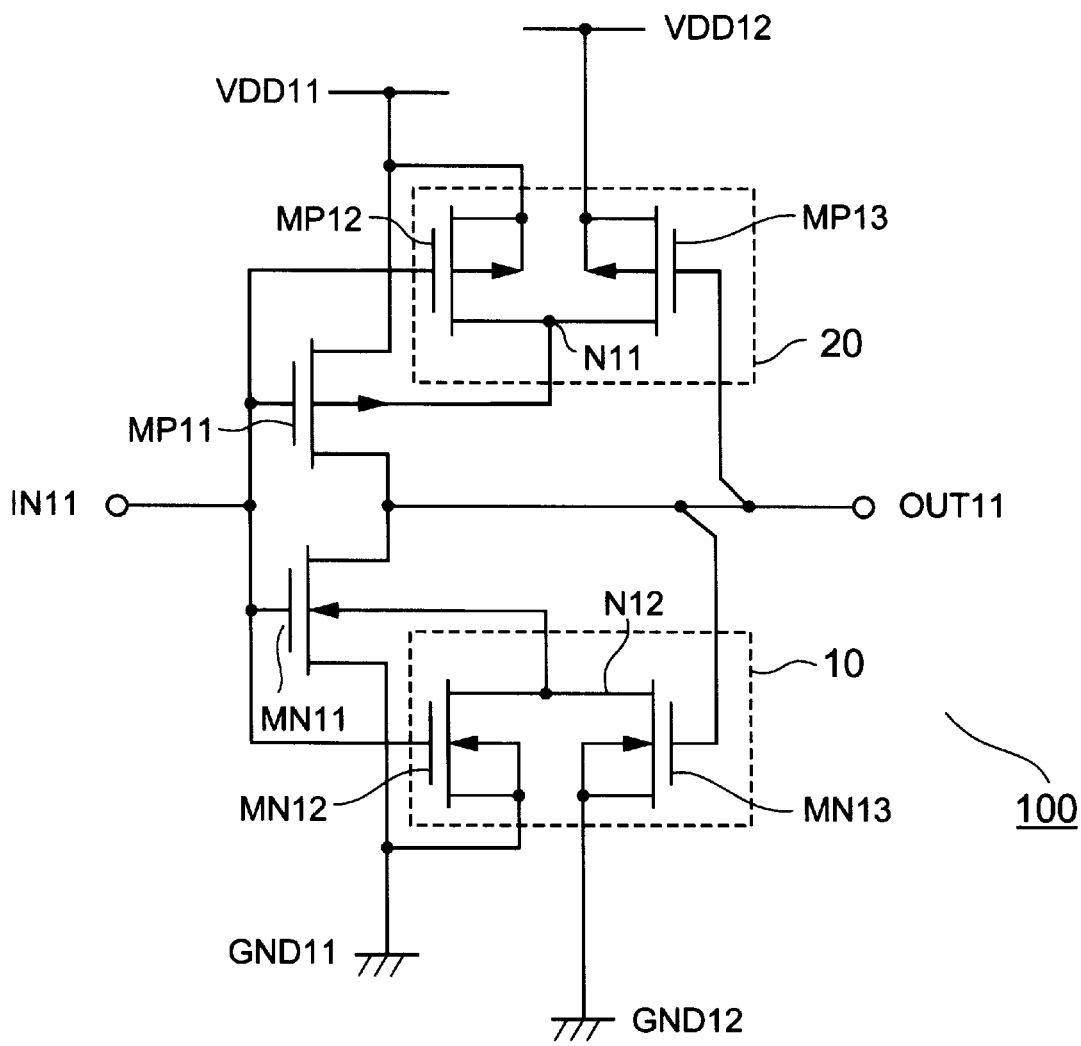
FIG. 1 is a circuit diagram of a logic circuit according to an embodiment of the present invention.

FIG. 1 is a circuit diagram of a logic circuit 100 according to a first embodiment of the present invention, which constitutes an inverter logic circuit. In this description, it is assumed that each of transistors constituting the logic circuit 100 is assumed as having a structure by which a substrate potential can be changed. Further, it is assumed that each transistor is of the enhancement type and the logic circuit 100 is integrated on a semiconductor substrate. A semiconductor device to which the logic circuit 100 is applied is not specifically limited. That is, the semiconductor device may be a micro computer, a memory or an ASIC.

Similarly to a usual inverter circuit, the logic circuit 100 shown in FIG. 1 includes a P channel type MIS transistor MP11 and an N channel type transistor MN11 which are connected between a first high potential side power source VDD11 and a first low potential side power source GND11 and substrate potential control circuits 10 and 20. The substrate potential control circuit 10 controls the substrate potential of the N channel type MIS transistor MN11 and the substrate potential control circuit 20 controls the substrate potential of the P channel type MIS transistor MP11.

In detail, the substrate potential control circuit 10 includes an N channel type MIS transistor MN12 connected between the first low potential side power source GND11 and the substrate of the N channel type MIS transistor MN11 and a N channel type MIS transistor MN13 connected between a second low potential side power source GND12 and the substrate of the N channel type MIS transistor MN11. A gate electrode of the N channel type MIS transistor MN12 is connected to an input terminal IN11 and a gate electrode of the N channel type MIS transistor MN13 is connected to an output terminal OUT11. It should be noted that a potential of the second low potential side power source GND12 is lower than a potential of the first low potential side power source GND11.

On the other hand, the substrate potential control circuit 20 includes a P channel type MIS transistor MP12 connected between the first high potential side power source VDD11 and the substrate of the P channel type MIS transistor MP11 and a P channel type MIS transistor MP13 connected between a second high potential side power source VDD12 and the substrate of the P channel type MIS transistor MP11. A gate electrode of the P channel type MIS transistor MP12 is connected to the input terminal IN11 and a gate electrode of the P channel type MIS transistor MP13 is connected to the output terminal OUT11. It should be noted that a potential of the second high potential side power source VDD12 is higher than a potential of the first high potential side power source VDD11.

The second low potential side power source GND12 and the second high potential side power source VDD12 are not specifically limited. They may be internal power sources provided internally of the semiconductor device. The second low potential side power source GND12 may be provided by a circuit shown in FIG. 4 and the second high potential side power source VDD12 may be provided by a circuit shown in FIG. 5. The circuits shown in FIGS. 4 and 5 may be integrated on the semiconductor substrate on which the logic circuit 100 is formed.

Figure 4:
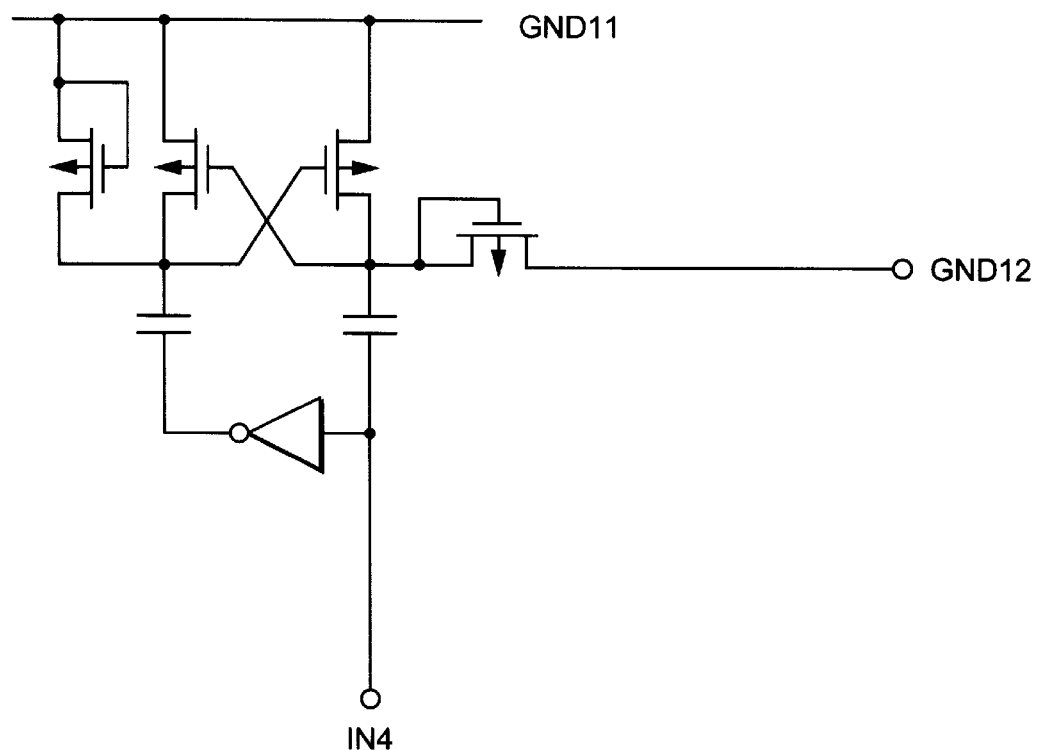
FIG. 4 is a circuit diagram of a circuit for providing a second low potential power source GND12.
Figure 5:
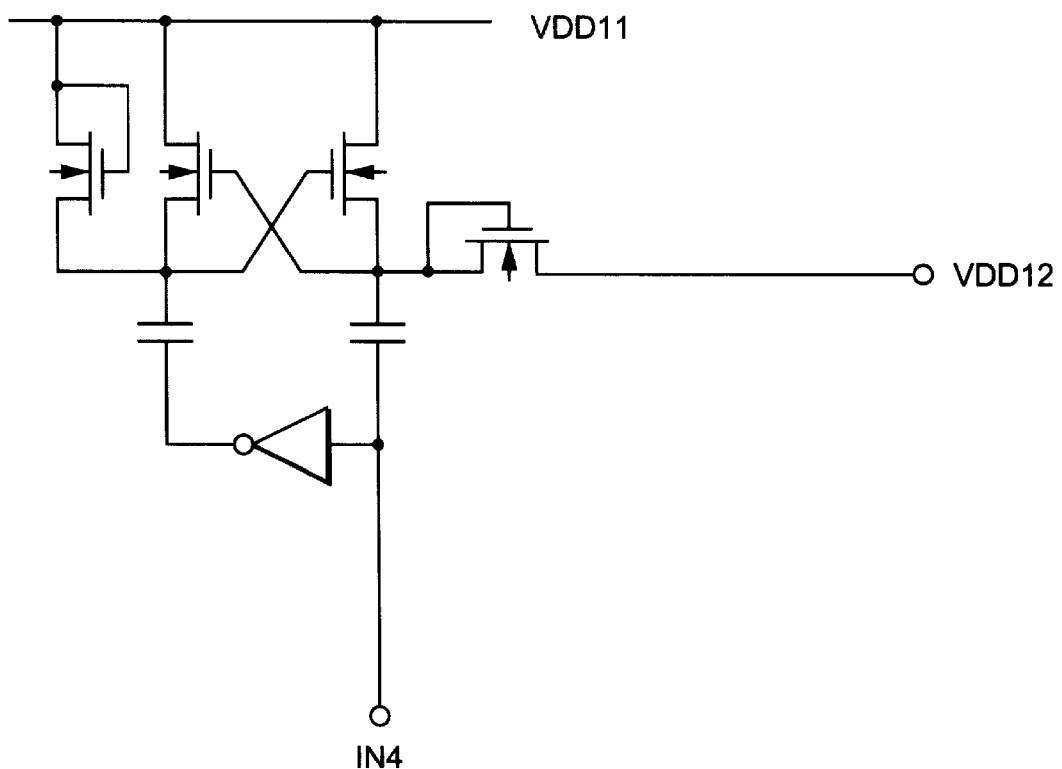
FIG. 5 is a circuit diagram of a circuit for providing a second high potential power source GND12.

The circuit shown in FIG. 4 provides the second low potential side power source GND12 whose potential is lower than that of the first low potential side power source GND11 by one step of an absolute value of the threshold value of the transistor, by supplying a negative logic pulse to an input terminal IN4 and the circuit shown in FIG. 5 provides the second high potential side power source VDD12 whose potential is higher than that of the first high potential side power source VDD11 by an absolute value of the threshold value of the transistor, by supplying a positive logic pulse to an input terminal IN5. When the potential of the second low potential side power source GND12 is raised by an operation of the logic circuit 100, it is possible to lower it again by supplying the negative logic pulse to the input terminal IN4 and, when the potential of the second high potential side power source VDD12 is lowered, it is possible to raise it again by supplying the positive logic pulse to the input terminal IN5.

Incidentally, the circuit shown in FIG. 4 is a mere example of a circuit for providing the second low potential side power source GND12 and the circuit shown in FIG. 5 is also a mere example of a circuit for providing the second high potential side power source VDD12. Therefore, the second low potential side power source GND12 and the second high potential side power source VDD12 may be provided by other circuits or the potentials corresponding thereto may be directly given externally of the semiconductor device.

Now, the operation of the logic circuit 100 will be described.

When a potential level of the input terminal IN11 becomes substantially equal to a potential level of the first high potential side power source VDD11, that is, a high level signal is input to the input terminal, the transistors MN11 and MN12 are turned ON and the transistors MP11 and MP12 are turned OFF. With the N channel type MIS transistor MN11 turned ON, a potential level of the output terminal OUT11 becomes as low as the potential of the first low potential side power source GND11 and, therefore, the transistor MP13 is turned ON and the transistor MN13 is turned OFF.

Therefore, a potential of a node N11 becomes substantially equal to the potential of the second high potential side power source VDD12 and a potential of a node N12 becomes substantially equal to the potential of the first low potential side power source GND11.

Therefore, a potential of the substrate becomes higher than a source potential of the transistor MP11, so that the absolute value of the threshold voltage Vt thereof becomes larger than a normal value due to the substrate bias effect resulting in a reduced leak current. Incidentally, the term "normal value" means an absolute value of Vt when the source potential is equal to the substrate potential and the value of Vt in such state is specifically Vt0. On the other hand, since a potential of the first low potential side power source is applied as the substrate bias voltage of the N channel type MIS transistor MN11, the threshold value Vt thereof is Vt0 so that it is possible to supply an enough drain current. In this state, the logic circuit 100 becomes a first stable state.

Considering a case where the potential of the input terminal IN11 becomes low level substantial equal to the potential of the first low potential side power source GND11, since Vt of the transistor MP12 is Vt0 and a change of Vt due to the substrate bias effect is smaller than that of the transistor MP11, the state of the transistor MP12 is changed from OFF to ON with the potential drop of the input terminal IN11. When the potential of the input terminal IN11 is further lowered, the transistor MP11 is changed from OFF state to ON state. Substantially simultaneously therewith, both the transistors MN11 and MN12 are changed in state from ON to OFF. Thus, the output level of the output terminal OUT11 is raised. With this increase of the output level of the output terminal OUT11, the state of the transistor MP13 is changed from ON to OFF and the state of the transistor MN13 is changed from OFF to ON. Therefore, the substrate potential of the transistor MP11 becomes the level of the first high potential side power source VDD11 due to the transistor MP12 and the absolute value of its Vt becomes substantially Vt0 and the substrate potential of the transistor MN11 becomes substantially the same as the level of the second low potential side power source GND12 due to the operation of the transistor MN13 and its Vt becomes large. As a result, the leak current becomes small. In this state, the logic circuit 100 becomes a second stable state.

Then, when the potential of the input terminal IN11 raises again to a value which is substantially the same as the potential of the first high potential side power source VDD11, the state of the transistor MN12 is changed from OFF to ON with the potential increase of the input terminal IN11 since Vt of the transistor MN12 is Vt0 and a change of Vt due to the substrate bias effect is smaller than that of the transistor MN11. When the potential of the input terminal IN11 is further increased, the transistor MN11 is changed from ON state to OFF state and, then, both the transistors MP11 and MP12 are changed in state from ON to OFF. Thus, the output level of the output terminal OUT11 is dropped. With this drop of the output level of the output terminal OUT11, the state of the transistor MN13 is changed from ON to OFF and the state of the transistor MP13 is changed from OFF to ON. Therefore, the substrate potential of the transistor MN11 becomes the level of the first low potential side power source GND11 due to the transistor MN12 and the absolute value of its Vt becomes substantially Vt0. On the other hand, the substrate potential of the transistor MP11 becomes substantially the same as the level of the second high potential side power source VDD12 due to the operation of the transistor MP13 and the absolute value of Vt becomes larger than the absolute value of Vt0. As a result, the leak current becomes small. In this state, the logic circuit 100 returns to the first stable state.

In this manner, the two stable states of the logic circuit of the present invention are repeated alternately with respect to the input level variation at the input terminal IN11.

Since, in the logic circuit 100 of the present invention, the substrate potentials of the N channel type MIS transistor MN11 and the P channel type MIS transistor MP11 which constitute the inverter circuit are controlled correspondingly to the levels of the input signal and the output signal so that the absolute value of the threshold voltage of the transistor in OFF state is increased without changing the absolute value of the threshold voltage of the other transistor in ON state, as mentioned above, the leak current is not increased and a high operation speed is maintained even when the power source voltage is lowered.

In more detail, assuming that the potential of the first high potential side power source VDD is 2.0V and the potential of the first low potential side power source is 0V, the increase of the leak current can be prevented by setting the potential of the second high potential side power source VDD to 2.3 to 2.4V and that of the second low potential side power source GND to −0.3V to −0.4V. It should be noted that these voltage values are examples and can be set to other values.

As described, the voltage value 0.3V to 0.4V which is a potential difference between the first high potential side power source VDD11 and the second high potential side power source GND11 as well as a potential difference between the first low potential side power source GND11 and the second low potential side power source GND12 is an absolute value of the threshold voltage of the transistor. That is, when the power consumption is realized by lowering the power source voltage down to 2.0V as in this embodiment, the absolute value of the threshold voltage of the transistor is dropped to about 0.3V to 0.4V in order to prevent the switching speed from being lowered.

Thus, according to the logic circuit 100 of the first embodiment, the leak current is not increased even when the absolute value of the threshold voltage of the transistor is lowered in order to prevent the switching speed from being lowered and, therefore, it becomes possible to realize both the reduction of power consumption and the high operation speed. Therefore, when the logic circuit 100 of the present invention is applied to a semiconductor device having high operating frequency, heat generation thereof is reduced and the heat radiator and/or cooling device becomes unnecessary or at least simple, resulting in that the total cost is reduced. On the other hand, when the logic circuit 100 of the present invention is applied to a battery-driven mobile device, the driving time of the battery can be elongated.

Although an occupation area of the logic circuit 100 may have some defect since it includes, in addition to the P channel type MIS transistor MP11 and the N channel type MIS transistor MN11 which are necessary for the logic operation, four transistors, the above mentioned merits of this logic circuit outweigh such defect.

That is, assuming that the size of each of the transistors which are necessary for the logic operation is L=1 μm and W=5 μm, the size of each of the four additional transistors MP12, MP13, MN12 and MN13 may be one fourth to one fifth of the size of the MIS transistor at most. That is, each of the four additional transistors may be L=0.25 μm and W=1 μm, so that the area occupied by them is not substantial. It is known that, when the power source voltage is lowered to operate the logic circuit at low voltage, by lowering the absolute value of the threshold voltage of the transistor down to about 0.4V, the leak current of the transistor becomes very large and, when the absolute value of the threshold voltage is further reduced by 0.1V, the leak current becomes about 100 times. Therefore, the advantages of the present invention become substantial when a low voltage operation is required and it is necessary to further reduce the absolute value of the threshold voltage of the transistor.

Power consumption of the circuits for providing the second low potential side power source GND12 and the second high potential side power source VDD12 can be restricted to very small values. The reason for this is that the second low potential side power source GND12 and the second high potential side power source VDD12 supply voltages to the substrates of the transistors and large power is not required to drive them. Therefore, when the circuits shown in FIGS. 4 and 5 are used for the second low potential side power source GND12 and the second high potential side power source VDD12, there is no need of supplying pulses to the input terminals IN4 and IN5 frequently.

A logic circuit 200 according to another embodiment will be described with reference to FIG. 2.

The logic circuit 200 is a 2-input NAND circuit integrated on a semiconductor substrate.

Figure 2:
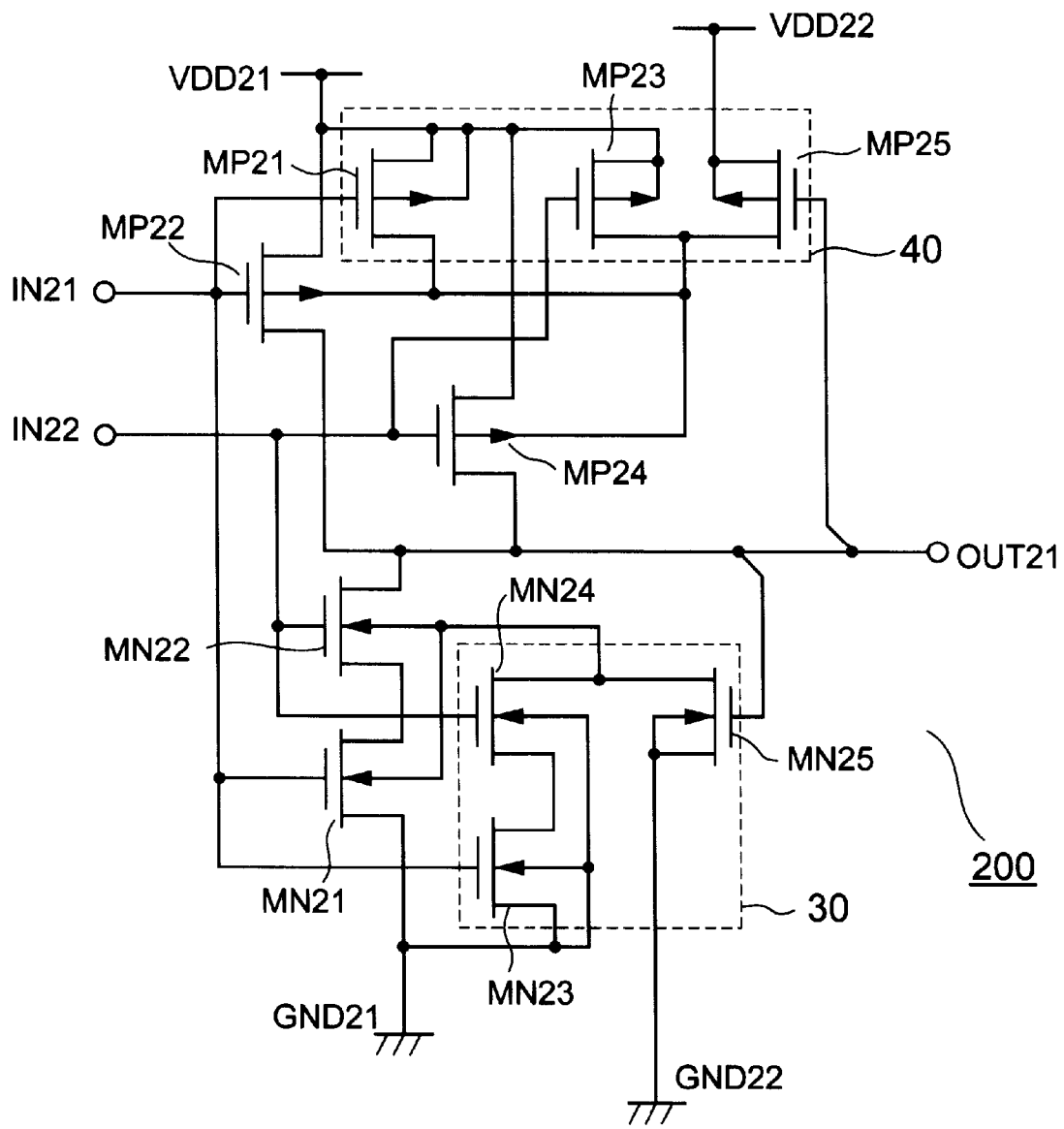
FIG. 2 is a circuit diagram of a logic circuit according to another embodiment of the present invention.

As shown in FIG. 2, the logic circuit 200 includes P channel type MIS transistors MP22 and MP24 connected in parallel between a first high potential side power source VDD21 and an output terminal OUT21, N channel type MIS transistors MN21 and MN22 connected in series between a first low potential side power source GND21 and the output terminal OUT21 and substrate potential control circuits 30 and 40. The substrate potential control circuit 30 is used to control the substrate potentials of the N channel type MIS transistors MN21 and MN22 and the substrate potential control circuit 40 is used to the substrate potentials of the P channel type MIS transistors MP22 and MP24.

In detail, the substrate potential control circuit 30 is composed of N channel type MIS transistors MN23 and MN24 connected in series between the first low potential side power source GND21 and the substrate of N channel type MIS transistors MN21 and MN22 and an N channel type MIS transistor MN25 connected between a second low potential side power source GND22 and the substrates of the N channel type MIS transistors MN21 and MN22. A gate electrode of the N channel type MIS transistor MN23 is connected to an input terminal IN21, a gate electrode of the N channel type MIS transistor MN24 is connected to an input terminal IN22 and a gate electrode of the N channel type MIS transistor MN25 is connected to the output terminal OUT21. A potential of the second low potential side power source GND22 is lower than that of the first low potential side power source GND21.

On the other hand, the substrate potential control circuit 40 is composed of N channel type MIS transistors MN21 and MN23 connected in parallel between the first high potential side power source VDD21 and the substrates of P channel type MIS transistors MP22 and MP23 and a P channel type MIS transistor MP25 connected between a second high potential side power source VDD22 and the substrates of the P channel type MIS transistors MN22 and MN24. A gate electrode of the P channel type MIS transistor MP21 is connected to the input terminal IN21, a gate electrode of the P channel type MIS transistor MP23 is connected to the input terminal IN22 and a gate electrode of the P channel type MIS transistor MP25 is connected to the output terminal OUT21. A potential of the second high potential side power source VDD22 is higher than that of the first high potential side power source VDD21.

The second low potential side power source GND22 and the second high potential side power source VDD22 can be realized by the circuits shown in FIGS. 4 and 5.

In the logic circuit 200, the P channel type MIS transistors for logic operation are connected in parallel with respect to an input from the input terminal IN21 and the N channel type MIS transistors for logic operation are connected in series with respect to the input from the input terminal IN22. With this construction, the transistors for controlling the substrate potentials of the transistors for logic operation are connected in parallel when the corresponding transistors for logic operation are connected in parallel and the transistors for substrate potential control are connected in series when the corresponding transistors for logic operation are connected in series.

An operation of the logic circuit 200 will be described.

First, considering a case where potentials which are substantially the same as the potential of the first high potential side power source VDD21 are having been supplied to the respective input terminals IN21 and IN22, the P channel type MIS transistors MP22 and MP24 for logic operation become OFF state and the N channel type MIS transistors MN21 and MN22 become ON state when input signals are supplied to the input terminals IN21 and IN22. Thus, the output terminal OUT21 sinks a load current through a conductive path formed by the N channel type MIS transistors MN21 and MN22, so that the potential of the output terminal OUT21 is dropped down to the level of the first low potential side power source GND21.

On the other hand, with the high levels of the input terminals IN21 and IN22, the P channel type MIS transistors MP21 and MP23 which supply the substrate potentials of the P channel type MIS transistors MP22 and MP24 for logic operation become OFF state and the P channel type MIS transistor MP25 becomes ON state with the low level signal of the output terminal OUT21. Thus, the absolute values of Vt of the P channel type MIS transistors MP22 and MP24 become larger than the absolute value of Vt0 so that the leak current is reduced.

Considering the substrate potentials of the N channel type MIS transistors MN21 and MN22 for logic operation, the N channel type MIS transistors MN23 and MN24 are turned ON by the high level inputs of the input terminals IN21 and IN22 and the N channel type MIS transistor MN25 is turned OFF by the low level of the output terminal OUT21. Therefore, the absolute values of Vt of the N channel type MIS transistors MN21 and MN22 for logic operation become low since the substrate potentials thereof become the same as the potential of the first low potential side power source GND21. Therefore, the N channel type MIS transistors MN21 and MN22 for logic operation can sufficiently sink the load current. In this state, the logic circuit 200 becomes a first stable state.

Then, when the input potential of the input terminal IN21 is dropped to a value close to the level of the first low potential side power source GND21, the state of the P channel type MIS transistor MP21 is changed from OFF to ON. With this state change, the substrate potential of the P channel type MIS transistors MP22 and MP24 become intermediate value between the potentials of the second high potential side power source VDD22 and the first high potential side power source VDD21. Further, the state of the P channel type MIS transistor MP22 for logic operation is changed from OFF to ON. On the other hand, since the state of the N channel type MIS transistor MN21 for logic operation is changed from ON to OFF, the conductive path through the N channel type MIS transistors MN21 and MN22 for logic operation disappears. Incidentally, the state of the P channel type MIS transistor MP24 is kept OFF.

As mentioned above, a source current is supplied to the output terminal OUT21 from the first high potential side power source VDD21 through the P channel type MIS transistor MP22 for logic operation. When the level of the output terminal OUT21 is raised by this source current, the state of the P channel type MIS transistor MP25 is changed from ON to OFF. Thus, the potential of the first high potential side power source VDD21 is applied to the substrates of the P channel type MIS transistors MP22 and MP24 for logic operation and the absolute value of Vt of the P channel type MIS transistor for logic operation becomes substantially equal to Vt0.

On the other hand, the N channel type MIS transistors MN23, MN24 and MN25 become OFF, ON and ON states, respectively. Therefore, the substrate potentials of the N channel type MIS transistors MN21 and MN22 for logic operation become the potential level of the second low potential side power source GND11 and the absolute value of Vt becomes larger than the absolute value of Vt0. Therefore, the leak current of the N channel type MIS transistors MN21 and MN22 is reduced. In this state, the logic circuit 200 becomes a second stable state.

Further, when the input potential of the input terminal IN22 drops to a value close to the potential level of the first low potential side power source GND21, the state of the P channel type MIS transistor MP24 is changed from OFF to ON and, together with the P channel type MIS transistor MP22 which is ON state, supplies the load current to the output terminal OUT21. On the other hand, the state of the N channel type MIS transistor MN22 for logic operation is changed from ON to OFF in response to the signal change of the input terminal IN22. Thus, together with the N channel type MIS transistor MN21 which is in OFF state, the leak current is further reduced. The Vt's of the respective MIS transistors for logic operation are kept unchanged, the absolute values of Vt's of the P channel type MIS transistors are equal to Vt0 and the absolute values of Vt's of the N channel type MIS transistors are kept larger than Vt0. In this state, the logic circuit 200 becomes a third stable state.

Then, when the potential level of the input terminal IN21 is raided up to the potential level of the first high potential side power source VDD21, the state of the N channel type MIS transistor MN23 is changed from OFF to ON. However, the substrate potentials of the N channel type MIS transistors MN21 and MN22 for logic operation are kept at the potential level of the second low potential side power source GND22 and the absolute values of Vt's of these transistors are kept larger than that of Vt0. With the increase of the level of the input terminal IN21, the state of the N channel type MIS transistor MN21 for logic operation is changed from OFF to ON.

Simultaneously therewith, the states of the P channel type MIS transistors MP22 and MP21 for logic operation are changed from ON to OFF, respectively. The states of other transistors for logic operation than the transistors MP22 and MP21 are unchanged, that is, the P channel type MIS transistors MP24 and MP23 for logic operation are ON, respectively, the N channel type MIS transistors MN22 and MN24 for logic operation are OFF, respectively, and the output terminal OUT21 outputs a high potential level which is substantially the same as the potential level of the first high potential side power source VDD21. Therefore, the P channel type MIS transistor MP25 is OFF and the N channel type MIS transistor MN25 is ON. Therefore, the absolute values of Vt's of the P channel type MIS transistors MP22 and MP24 for logic operation are equal to the absolute value of Vt0 and the absolute values of Vt's of the N channel type MIS transistors MN21 and MN22 for logic operation are larger than the absolute value of Vt0. Therefore, the leak current of the N channel type MIS transistors are restricted to a small value. In this state, the logic circuit 200 becomes a fourth stable state.

Then, when the potential level of the input terminal IN22 is raised up to the potential level of the first high potential side power source VDD21, the state of the N channel type MIS transistor MN22 for logic operation is changed from OFF to ON. Simultaneously therewith, the state of the P channel type MIS transistor MP24 for logic operation is changed from ON to OFF, the state of the P channel type MIS transistor MP23 is changed from ON to OFF and the state of the N channel type MIS transistor MN24 is changed from OFF to ON. The states of other transistors are unchanged, that is, the P channel type MIS transistor MP22 for logic operation is OFF, the P channel type MIS transistor MP21 is OFF, the N channel type MIS transistor MN21 for logic operation is On and the N channel type MIS transistor MN23 is ON.

Under the circumstance, the potential of the output terminal OUT21 is reduced to the potential level of the first low potential side power source GND21 by sinking the load current since the N channel type MIS transistors MN21 and MN22 for logic operation are ON and the P channel type MIS transistors MP22 and MP24 for logic operation are OFF. With the reduction of the output potential level of the output terminal OUT21, the state of the P channel type MIS transistor MP25 is changed from OFF to ON and the state of the N channel type MIS transistor MN25 is changed from ON to OFF. Therefore, the substrate potentials of the P channel type MIS transistors MP22 and MP24 for logic operation become the potential level of the second high potential side power source VDD22 and the absolute value of Vt becomes larger than the absolute value of Vt0, resulting in a reduced leak current.

On the other hand, the substrates of the N channel type MIS transistors MN21 and MN22 for logic operation are applied with the potential level of the first low potential side power source GND21 and the absolute value of its Vt becomes substantially equal to the absolute value of Vt0, so that it is possible to sufficiently sink the load current. In this state, the logic circuit 200 is returned to the first stable state.

As described, the logic circuit 200 can reduce the leak current with keeping the operation speed thereof, similarly to the logic circuit 100.

Figure 3:
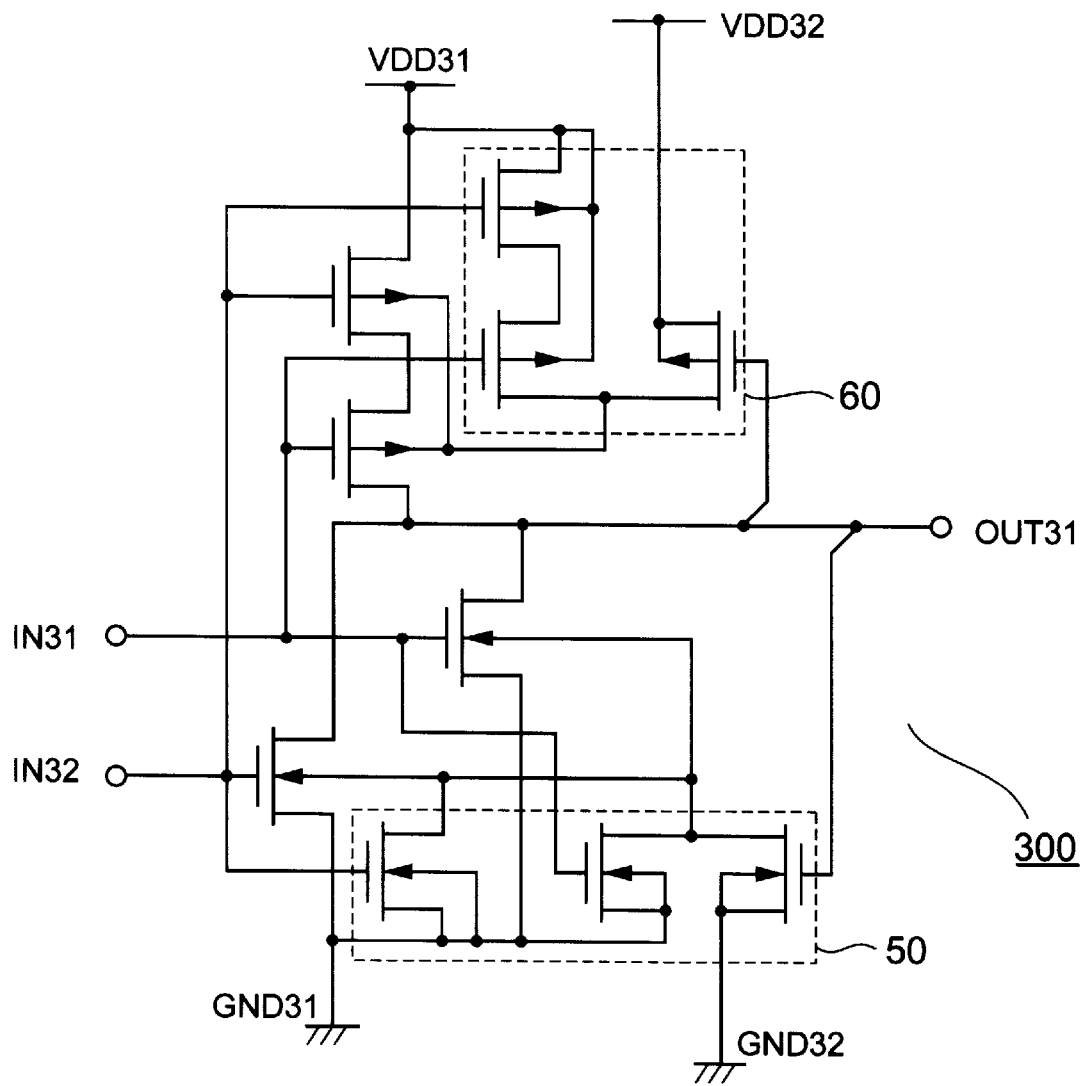
FIG. 3 is a circuit diagram of a logic circuit according to a further embodiment of the present invention.

Although detailed description is omitted, the present invention can be applied to a 2-input NOR logic circuit 300 such as shown in FIG. 3. In the 2-input NOR logic circuit 300 shown in FIG. 3, the substrate potentials of the transistors for logic operation is controlled by substrate potential control circuits 50 and 60.

It should be noted that the present invention is not limited to the logic circuits 100, 200 and 300 and can be applied to various logic circuits.

Figure 6:
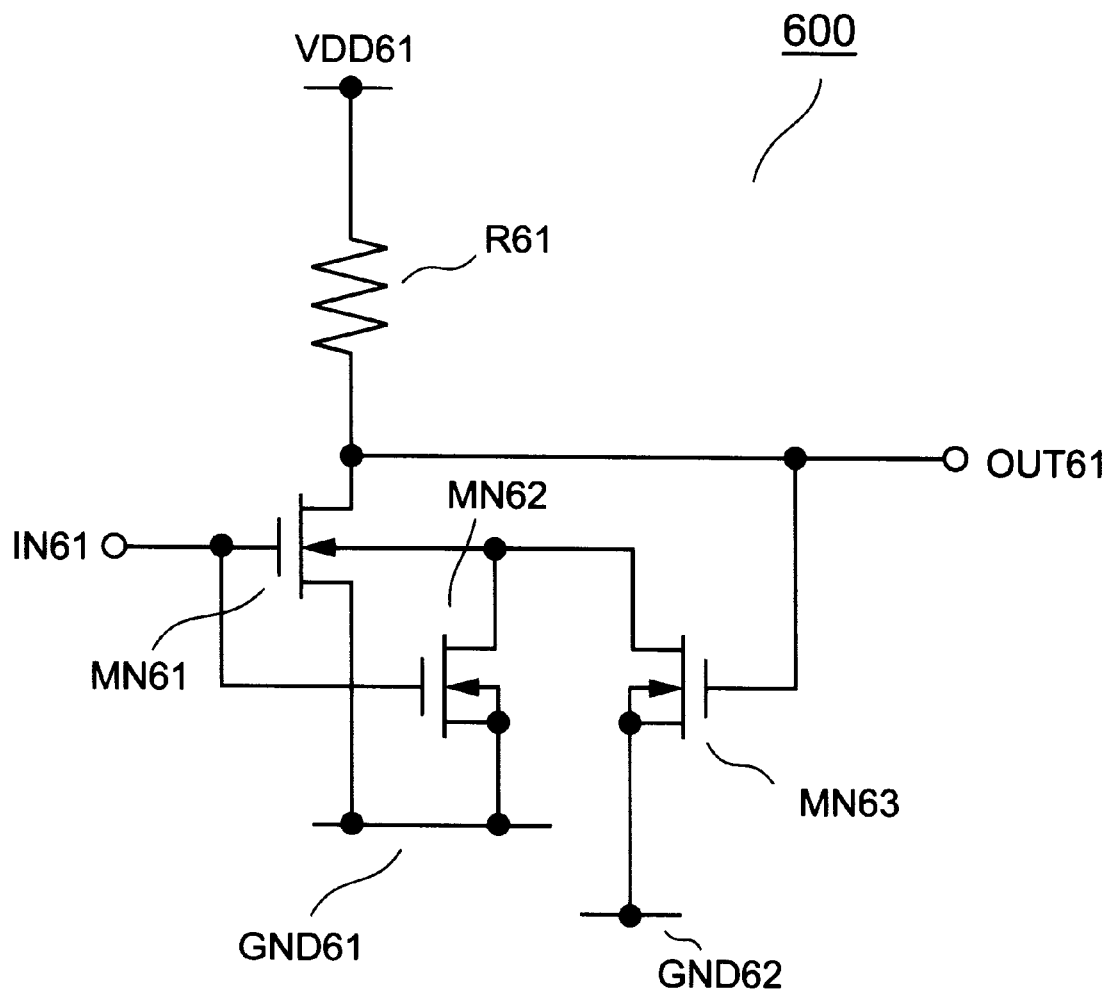
FIG. 6 is a circuit diagram of a logic circuit according to another embodiment of the present invention.
Figure 7:
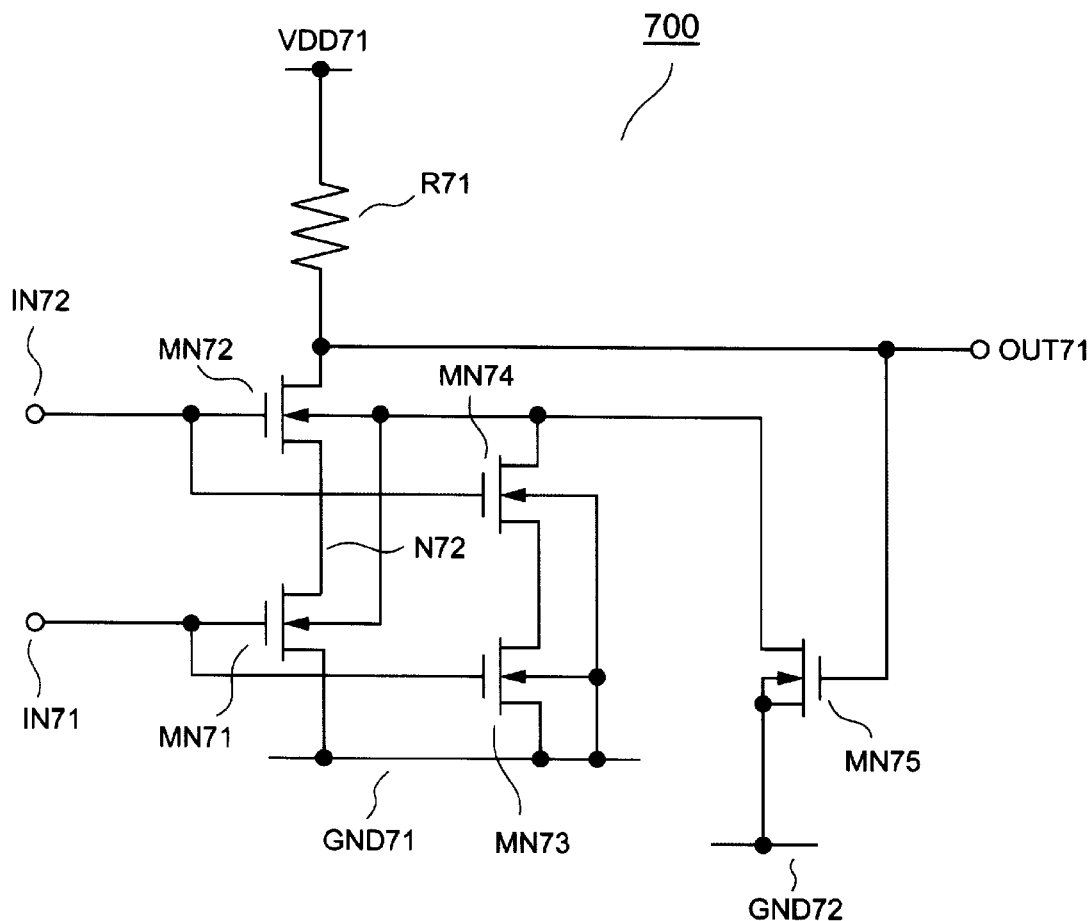
FIG. 7 is a circuit diagram of a logic circuit according to another embodiment of the present invention.
Figure 8:
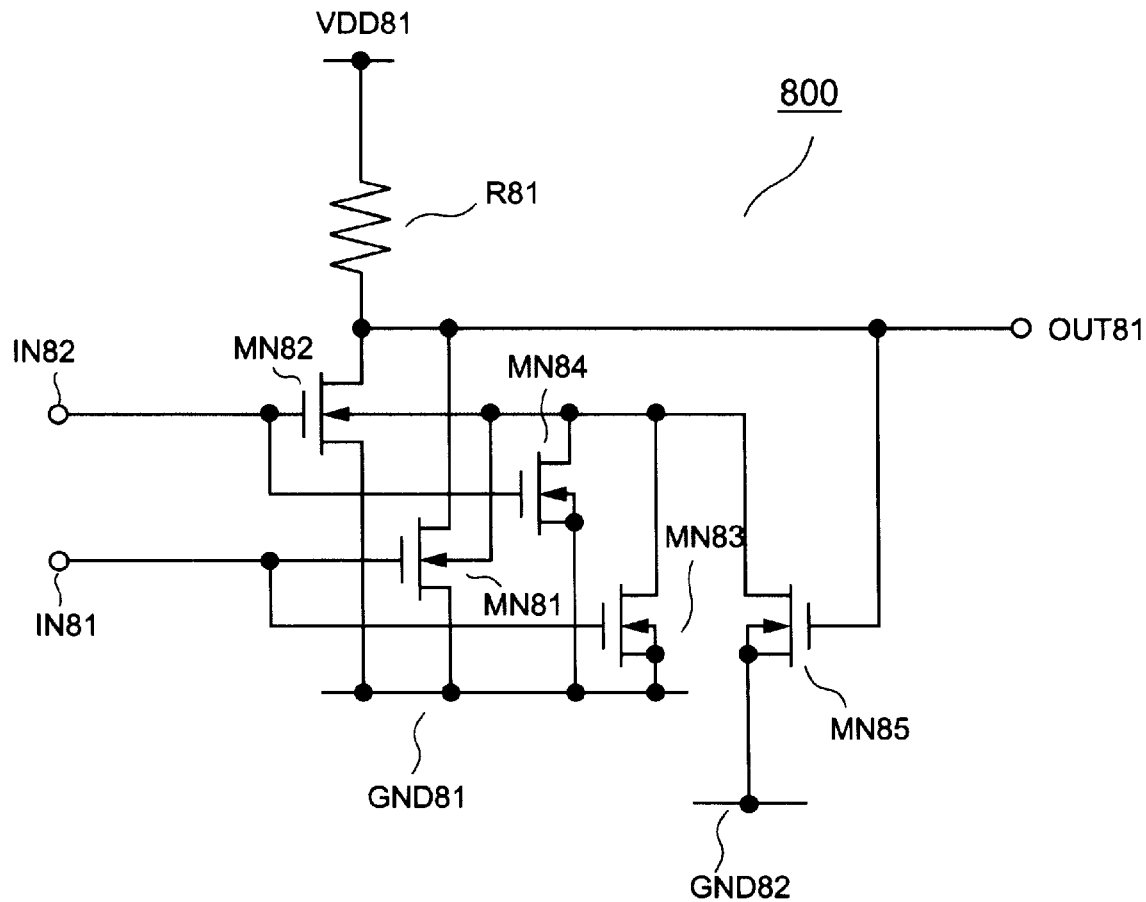
FIG. 8 is a circuit diagram of a logic circuit according to a further embodiment of the present invention.

For example, the present invention can be applied in a case where an inverter 600 is constructed with a pull-up resistor R61 as shown in FIG. 6. Further, the present invention can be applied to a case where a 2-input NAND logic circuit 700 is constructed with a pull-up resistor R71 as shown in FIG. 7. Further, the present invention can be applied to a case where a 2-input NOR logic circuit 800 is constructed with a pull-up resistor R81 as shown in FIG. 8.

As described hereinbefore, according to the present invention, there is no increase of the leak current even when the absolute value of the threshold voltage of the transistor in order to prevent the switching speed from being lowered as in the conventional technique and, therefore, it is possible to satisfy both the reduction of power consumption and the high operation speed of the logic circuit. Consequently, the heat generation is reduced when the present invention is applied to a semiconductor device having high operation frequency and there is no need of providing heat radiator and/or cooling device. Since, even if such device is necessary, the construction thereof can be simple. Therefore, it is possible to reduce the total cost of the logic circuit. On the other hand, when the present invention is applied to a mobile device which is driven by a battery, it is possible to elongate the driving time thereof due to the reduced power consumption.

What is claimed is:

1. A logic circuit comprising:
   an output node;
   a first transistor of a first conductivity type connected between a first power source and said output node;
   a second transistor of a second conductivity type connected between a second power source and said output node;
   an input node connected to control electrodes of said first and second transistors;
   a first control circuit for controlling a potential of a substrate of said first transistor in response to signals at said input node and output node without employing a potential of the signal at said output node; and
   a second control circuit for controlling a potential of a substrate of said second transistor in response to said signals on said input node and output node.

2. A logic circuit comprising:
   a first transistor of a first conductivity type connected between a first power source and an output node;
   a second transistor of a second conductivity type connected between a second power source and said output node;
   an input node connected to control electrodes of said first and second transistors;
   a first control circuit for supplying a potential different from a source potential of said second transistor to substrate of said second transistor in response to said first transistor being in a conductive state and said second transistor being in a non-conductive state; and
   a second control circuit for supplying a potential different from a source potential of said first transistor to substrate of said first transistor in response to said first transistor being in a non-conductive state and said second transistor being in a conductive state.

3. The logic circuit as claimed in claim 2, wherein said first control circuit supplies a potential substantially equal to the source potential of said second transistor to said substrate of said second transistor in response to said first transistor being in said non-conductive state and a said second transistor being in said conductive state, and said second control circuit supplies a potential substantially equal to the source potential of said first transistor to said substrate of said first transistor in response to said first transistor being in said conductive state and a said second transistor being in said non-conductive state.

4. A logic circuit comprising:
   a first transistor of a first conductivity type connected between a first power source and an output node;
   a second transistor of a second conductivity type connected between a second power source and said output node;
   first control circuit for supplying a first potential different from a potential of said second power source to a substrate of said second transistor when a potential of said output node is substantially the same potential as said first power source; and
   second control circuit for supplying a second potential different from a potential of said first power source to a substrate of said first transistor when a potential of said output node is substantially the same potential as said second power source.

5. The logic circuit as claimed in claim 4, wherein said first potential is lower than said potential of said second power source and said second potential is higher than said potential of said first power source.

6. A logic circuit comprising:
   a first transistor of a first conductivity type connected between a first power source and an output node;
   a second transistor of a second conductivity type connected between a second power source and said output node;
   a third transistor of said first conductivity type connected between said first power source and a substrate of said first transistor;
   a fourth transistor of said second conductivity type connected between said second power source and a substrate of said second transistor;
   an input node connected to control electrodes of said first to fourth transistors;
   a fifth transistor of said first conductivity type connected between a third power source and said substrate of said first transistor and having a control electrode connected to said output node; and
   a sixth transistor of said second conductivity type connected between a fourth power source and said substrate of said second transistor and having a control electrode connected to said output node.

7. The logic circuit as claimed in claim 6, wherein a potential of said third power source is higher than a potential of any of said first, second and fourth power source and a potential of said fourth power source is lower than a potential of any of said first, second and third power source.

8. A logic circuit comprising:
   a first and second transistors of a first conductivity type connected in parallel between a first power source and an output node;
   a third and fourth transistors of a second conductivity type connected in series between a second power source and said output node;
   a fifth and sixth transistors of said first conductivity type connected in parallel between said first power source and at least one of substrates of said first and second transistors;

a seventh and eighth transistors of said second conductivity type connected in series between said second power source and at least one of substrates of said third and fourth transistors;

a first input node connected to control electrodes of said first, third, fifth and seventh transistors;

a second input node connected to control electrodes of said second, fourth, sixth and eighth transistors;

a ninth transistor of said first conductivity type connected between a third power source and at least one of said substrates of said first and second transistors and having a control electrode connected to said output node; and a tenth transistor of said second conductivity type connected between a fourth power source and at least one of said substrates of said third and fourth transistors and having a control electrode connected to said output terminal.

9. A logic circuit comprising a first power source, an output node, a transistor connected between said first power source and said output node, an input node connected to control electrode of said transistor, and a control circuit for controlling a potential of a substrate of said transistor in response to signals at said input node and output node without employing a potential of said output node as a potential of the substrate of said transistor.

10. A logic circuit comprising:

a first power source;

an output node;

a resistor connected between said first power source and said output node;

a first transistor connected between said output node and a second power source;

a second transistor connected between a substrate of said first transistor and said second power source;

an input node connected to control electrodes of said first and second transistors; and a third transistor connected between said substrate of said first transistor and said second power source and having a control electrode connected to said output node.

* * * * *